US005872339A

United States Patent [19]

Hanson

[11] Patent Number: 5,872,339

[45] Date of Patent: Feb. 16, 1999

[54] HIGH PERFORMANCE LOUDSPEAKER SYSTEM

[76] Inventor: Charles Anthony Hanson, 98 Canal St., New York, N.Y. 10002

[21] Appl. No.: 921,947

[22] Filed: Aug. 28, 1997

[51] Int. Cl.[6] .......... H05K 5/00

[52] U.S. Cl. .......... 181/144; 181/145; 181/152

[58] Field of Search .......... 181/144, 145, 181/147, 152, 156, 159, 160; 381/153, 156

[56] References Cited

U.S. PATENT DOCUMENTS

| | | | |
|---|---|---|---|
| Re. 32,183 | 6/1986 | Isaacs . | |
| 3,866,710 | 2/1975 | Cesati . | |
| 3,972,385 | 8/1976 | Hino et al. . | |
| 4,152,552 | 5/1979 | Meyer . | |
| 4,157,741 | 6/1979 | Goldwater . | |
| 4,391,346 | 7/1983 | Murakami . | |
| 4,437,540 | 3/1984 | Murakami et al. | 181/147 |
| 4,549,631 | 10/1985 | Bose . | |
| 4,628,528 | 12/1986 | Bose . | |
| 4,733,749 | 3/1988 | Newman . | |
| 4,776,428 | 10/1988 | Belisle . | |
| 4,836,237 | 6/1989 | Andrews . | |
| 4,923,031 | 5/1990 | Carlson | 181/144 |
| 4,930,596 | 6/1990 | Saiki . | |
| 5,004,067 | 4/1991 | Patronis . | |
| 5,010,977 | 4/1991 | Furukawa . | |
| 5,046,581 | 9/1991 | Mitchell . | |
| 5,092,424 | 3/1992 | Schreiber . | |
| 5,206,465 | 4/1993 | Jung . | |
| 5,526,456 | 6/1996 | Heinz . | |

OTHER PUBLICATIONS

Data Sheet 'Pro–AX Series Model PX–1060' (9 pages) Published by OAP Audio Buford Georgia, Date Unknown.
Cat 70 Data Sheet Published by Frazier Morilton Arizona, Date Unknown.
HandBook for Sound Engineers (2nd ED.) Sams (MacMillan Publishing, Indiana) 1991 pp. 545–547, 1425.
High Performance LoudSpeakers, Colloms, John Wiley & Sons New York 1991 pp. 195,189,183,115,5.

*Primary Examiner*—Khanh Dang
*Attorney, Agent, or Firm*—Robert W. J. Usher

[57] ABSTRACT

A loudspeaker system has a housing forming a first horn, and two low-mid range speakers mounted in the horn throat with front faces in opposition and rear faces in loading and detuning chambers formed by the housing. A third, high-mid speaker, of the same size and type is mounted to a rear of a second horn, integral with a phase plug which has a fourth, high frequency speaker coaxially mounted in a front end to form a high-mid/high frequency speaker assembly which spans the mouth of the first horn in coaxial loading relation with the front faces of the low-mid speakers to balance the rear loading. The rear face of the cone of the third speaker is sealed against the front pressure wave generated by the rear speakers. Both sealing portions and the phase plug are sufficiently close to the cone to avoid resonance therebetween at an upper limit of the operating frequency of the third speaker. The sealing portions and the rear face of the cone define an annular chamber which is vented by tubes to a chamber system in a casing of the second horn. The system operates at a high performance level over 100 Hz–20 kHz with only a single crossover point between speakers of the same size and type, reducing distortion.

24 Claims, 8 Drawing Sheets

HIGH PERFORMANCE LOUDSPEAKER SYSTEM

FIELD OF THE INVENTION

The invention relates to a loudspeaker system for producing sound of high quality and volume in areas such as auditoriums.

BACKGROUND OF THE INVENTION

Whilst many modern high performance applications utilizing digital systems require accurate reproduction of material that has a wide frequency range, typically 20 Hz–20 kHz, the range of 150 Hz–5 kH can be considered most important as it contains the range of maximum acuity of human ear, and the greatest concentration of information in normal program material.

Although, it is well recognized that a single transducer represents the ideal arrangement in providing a coherent point source wave front, none is available for accurately and efficiently reproducing the above range of 150 Hz–5 kHz let alone 20 Hz–20 kHz, at high sound pressure levels. Inherent limitations, notably, distortion of the higher frequencies by movement of the transducer cone through the extension required to reproduce the lower frequencies, restrict the lower range of the mid range speaker to a lower limit of 250 Hz, while reflections off the magnet, resonances around the apex of the cone and under the conventional dust cap, restrict the upper limit to 1–2 kHz. Consequently, technicians have generally accepted the restriction of a single mid range transducer to 250 Hz–2 kHz. Two further transducers, differently sized from the first mentioned transducer, are then required in such systems to cover the remaining frequency ranges, usually a 15–18 inch woofer and a 2–4 inch diaphragm high compression driver mated to a horn with two inch throat for high frequencies. However, such arrangement necessitates two crossovers, at 250 Hz and 2 kHz, respectively, between transducers of different sizes and therefore different transient responses, between 150 Hz and 350 Hz at the low end and between 1 kHz and 3 kHz at the high end, the latter also experiencing other distortions inherent at lower operating ranges of high frequency compression drivers and with a roll-off at, typically, 16 kHz.

It is well established that the different transient responses are a consequence of the speaker diaphragms of differing size and mass, the larger diaphragm being transiently slower so that it is still resonating from an earlier impulse when a subsequent impulse containing the same or another frequency is generated, so that, adjacent the crossover, where the same frequencies are generated, the larger transducer resonates over the transiently quicker response of the smaller transducer providing audible blurring. The result is a systemic “flat” frequency response consisting of parallel resonances in time created by electrical impulses arriving at different times from different transducers.

In one attempt to provide a single point source covering the vocal range with crossover points at 150 Hz and 600 Hz, U.S. Pat. No. 5,004,067 issued Apr. 2, 1991 to Patronis, teaches a horn loaded system for horizontally controlled cinema application in which a high frequency driver is mounted coaxially in front of a mid frequency loudspeaker wherein a portion of the high frequency driver acts as a phase plug for the driver of the mid frequency speaker to achieve controlled dispersion and increase efficiency. However, the patent teaching directs that the high frequency driver operate down to a frequency even lower than that of the conventional system, which would normally introduce a risk of commensurate significant distortion within the high frequency horn, and, actually, requires electronic equalization to compensate for roll-off. Furthermore, the diaphragm size difference of the drivers at the crossover taught is too great to avoid blurring. However, in a development of the teaching of U.S. Pat. No. 5,004,067, sold as the Pro-Ax series model PX-1060, by OAP Audio of Buford, Georgia, which is intended for use in a high performance environment, Patronis requires that the crossover point be raised from 600 Hz to 1250 Hz utilizing only a single 10 inch horn loaded transducer to reproduce the range of 250 Hz to 1250 Hz on the understanding that a separately housed subsystem would also be utilized for lower frequencies, which, of course reverts to the traditional two crossover points within the 150 Hz to 5 kHz range,-with their attendant disadvantages described above. In other respects the speakers system taught by Patronis follows the common approach of providing a horn mouth wider than it is tall to support a more controlled horizontal response, whereas in an auditorium for sound reproduction a tighter control of the vertical response is believed desirable to reduce reflections from the ceiling which is usually the nearest surface.

U.S. Pat. No. 4,836,327 issued 1989 to Andrews et al also teaches a coaxial assembly of mid and high frequency speakers but the high frequency driver is located behind the low frequency driver in substantially non-loading relation.

In another attempt to produce a single point source using multiple transducers taught by U.S. Pat. No. 5,526,456 issued Jun. 11, 1996 to Heinz, the high frequencies are modulated by the low frequencies produced in a common throat leading to distortion while the horn is of relatively complex form requiring precise expansion ratios and, therefore, expensive in design, if degradation is to be avoided. U.S. Pat. No. 4,391,346 issued 1983 to Murakami and U.S. Pat. No. 4,733,749 issued 1988 to Newman et al also teach a bass-reflex speaker for emulating a single point source by using multiple transducers, but only for frequencies in the low range.

SUMMARY OF THE INVENTION

It is one object of the invention to provide a high performance loudspeaker system that avoids such conventional systemic distortion at crossover points which are within the range of 150 Hz–5 kH so that, in particular, frequencies containing the greatest concentration of information in normal program material will be reproduced with higher fidelity, by utilizing only a single crossover within the above range which is between speakers of equivalent size and type and which, therefore, have equivalent transient responses.

According to one aspect of the invention, the above is accomplished by extending the useful upper range of the mid range speaker, eliminating distortion at higher frequencies by the provision of a phase plug which extends back to within a small distance from the pole piece and follows adjacent the contour of the cone and former, and by providing a vented chamber system, sealing the rear of the mid speaker with wall portions located at a minimum distance from the cone. This system is tuned below the operating range of the speaker to provide non resonant loading on the rear of the cone equal to the loading on the front of the cone.

This arrangement eliminates reflections off the magnet and basket, resonances around the apex of the cone and under the usual dust cap, which has been eliminated, while permitting extension of the cone, without distortion, enabling the mid range speaker to be driven up to 6 kHz, and, in addition, enables use of a high frequency driver of smaller size and, consequently, less distortion and greater control, up to higher frequencies, e.g. 21 kHz, mounted coaxially in front of the mid range speaker.

In order to provide adequate low mid frequency at a high power level down to 100 Hz, two speakers of a matched size and type to the high mid speaker are mounted in a medial horizontal plane on opposite wall portions of a horn having a mouth which is taller than it is wide, and the high mid speaker is mounted in said plane, spanning the width of the horn mouth in front of the low mid speakers, in loading relation therewith, directing the front wave of the low mid speakers thereabove and therebelow into the ambient via two horn mouth portions thereby providing a line source with a tightly controlled vertical response.

Vented chamber system of similar principle are also provided for the low mid speakers.

Another object of the invention is to provide a compact cost effective system which accommodates all speakers in a single compact cabinet and provides an effective point source in a cost effective construction.

According to the invention, a high performance loudspeaker system comprises a housing and four speakers mounted in the housing so as to provide a common direction of sound projection into the ambient and having respective speaker axes on a common plane, the housing comprising wall portions of a horn; a first and a second of the speakers being identical and having respective cones with front faces mounted in opposition on said wall portions; a third and a fourth of the speakers being mounted together coaxially, forming a speaker assembly, and the speaker assembly being mounted to the housing extending medially across the horn mouth in loading relation with front faces of the first and second speakers and cooperating with the wall portions to provide two, separate, horn mouth portions having areas at least equal to the areas of the cones of the first and second speakers and being aligned on respective opposite sides of and perpendicular to the common plane and in communication with both first and second speakers, the third speaker being of equivalent size to the first and second speakers and having a cone and means sealing a rear face of the cone against a front pressure wave generated by the first and second speakers.

The first and second speakers are operational over a low-mid frequency range, the third speaker being operational over a high-mid frequency range and the fourth speaker is operational over a high frequency range so that a range of approximately 100 Hz–21 kHz can be reproduced at a high performance level with only a single crossover between 150 Hz and 5 kHz between speakers of substantially equivalent size and type, thereby significantly reducing overall distortion of the system, while the inherent distortion produced by a high frequency driver operating at lower frequencies is avoided.

It will be understood that the mid range is generally 150 h–5 kH, the low-mid frequency range typically extends from approximately 100 Hz–600 Hz; the high-mid frequency range extends from approximately 600 Hz–6 kHz, and the high frequency range extends from approximately 6 kHz–21 kHz with the maximum acuity of human ear, the greatest concentration of information in normal program material, and the speech range, all being contained within the range of 100 Hz–6 kHz. High performance systems are systems which must produce sufficient power for auditoriums., It will be appreciated that the front face of a speaker is that side which moves outwardly in the direction of the generated sound wave when a positive electrical signal is applied.

Preferably, the housing provides first and second chambers communicating with respective rear waves of first and second speakers and having respective vents which cooperate with the first and second chambers to maintain a loading relation at respective rear faces of first and second speakers substantially equal to the loading at the front faces, and at least two further chambers with which the vents communicate in parallel, each further chamber having at least one port which opens to the ambient adjacent respective horn mouth portions for low frequency emission. This arrangement provides low frequency extension while equalizing the loading on both faces of respective first and second speaker cones. The bilateral symmetry and opposing relationship of the speakers assist in vibration cancellation while the independent, isolated chambers enable the tuning to remain if one speaker is blown. The division into two separate chambers per speaker also raises the frequency of the standing waves outside the first reflection.

An advantageous arrangement provides a second horn having an open apex and a mouth, the third speaker comprising a front face mounted to the apex and a pole piece, an air venting passageway extending axially through the pole piece from the front to a rear face and an encircling former, wound with a coil, and phase plug means having a front to rear axis of symmetry and mounted in front of the pole piece to extend coaxially therewith with and at a minimum separation therefrom sufficient to provide a cooling air admitting gap therebetween so as to channel cooling air, generated by the loading, and passing through the air venting passageway radially across a front face of the pole piece, cooling the former and coil. The phase plug cooperates with a wall of the former, the cone and the second horn to provide a constant expansion ratio extending substantially from the pole piece to the mouth of the second horn while maintaining a separation from the cone for clearance therebetween during maximum operational extension thereof in the system. The fourth, high frequency, speaker is independent of the mid speaker and may be removably mounted within the phase plug to permit selection of either slot or bullet tweeter for increased horizontal beam width or extended throw characteristics, respectively.

The third speaker may include a cone and a spider and a sealed rear of the speaker assembly can be shaped to follow a rear profile of the cone at a minimum separation from the cone and spider necessary to maintain clearance therebetween to permit maximum operational extension thereof in the system thereby to elevate the resonant frequency, improving higher frequency response. The proximity of the phase plug to the pole piece together with the provision of the contour pieces ameliorates distortion allowing a higher frequency crossover point.

Preferably, the means sealing the rear of the cone cooperates with the cone to form a first chamber and the speaker assembly includes at least one further expansion chamber and vent means in the sealed rear interconnects said first chamber and said at least one further expansion chamber and said further vent, so as to detune the rear wave below the operational crossover point of the first and second speakers with the third speaker and to balance the loading on front and rear faces of the cone.

Conveniently, the horn has a body casing in which at least some of said further expansion chambers are formed enabling a compact construction to be maintained. Conveniently, for low cost, said at least one further expansion chamber comprises a flexible tube.

The flexible tube connects the first chamber to the further expansion chambers providing a compact economical assembly, enabling use also as a satellite.

BRIEF DESCRIPTION OF THE DRAWINGS

A particular embodiment of the invention will now be described with reference to the accompanying drawings in which.

DESCRIPTION OF PARTICULAR EMBODIMENT

Figure 1:
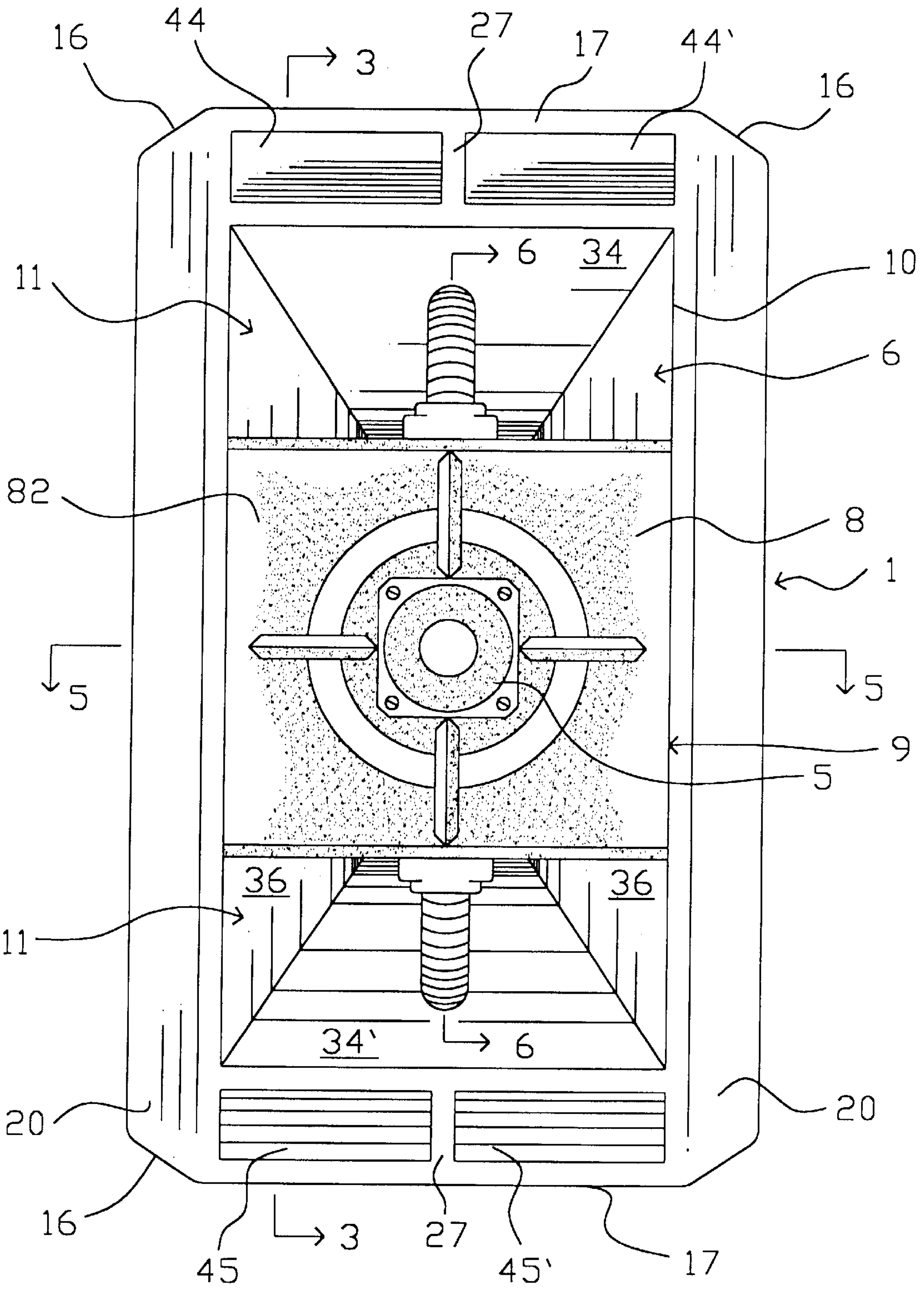
FIG. 1 is a front perspective view of the high performance loudspeaker system according to the invention.

As shown particularly in FIGS. 1–4, in brief, the high performance loudspeaker system comprises a cabinet or housing 1 having four speakers 2, 3, 4 and 5, mounted centrally thereto with horizontal, coplanar axes to project sound forwardly into the ambient. The first and second, rearmost speakers 2, 3, respectively, are identical, conventional 10 inch conical speakers with front faces mounted in opposition on a first horn 6 formed by the housing. The third speaker 4 is of identical size and equivalent type to the first and second speakers 2,3 and the fourth, front speaker 5 is a conventional 2 inch ring radiator bullet tweeter mounted coaxially therewith within a second horn 8 to form a front, speaker assembly 9 which extends completely across the mouth 10 of the first horn 6 dividing it into separated, upper and lower horn mouth portions 11 and loads front faces of the first and second speakers.

Figure 2:
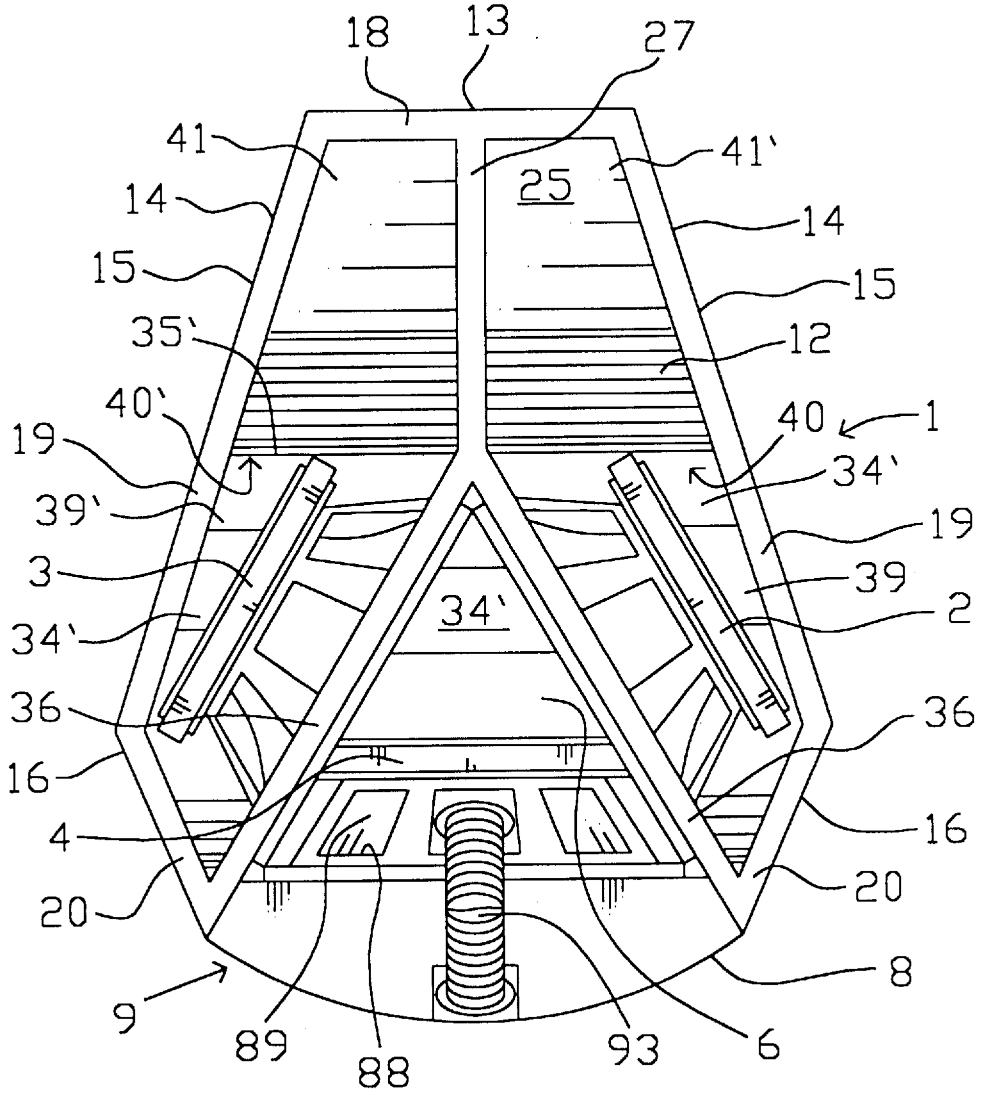
FIG. 2 is a plan view with top and upper inclined housing panels removed.
Figure 3:
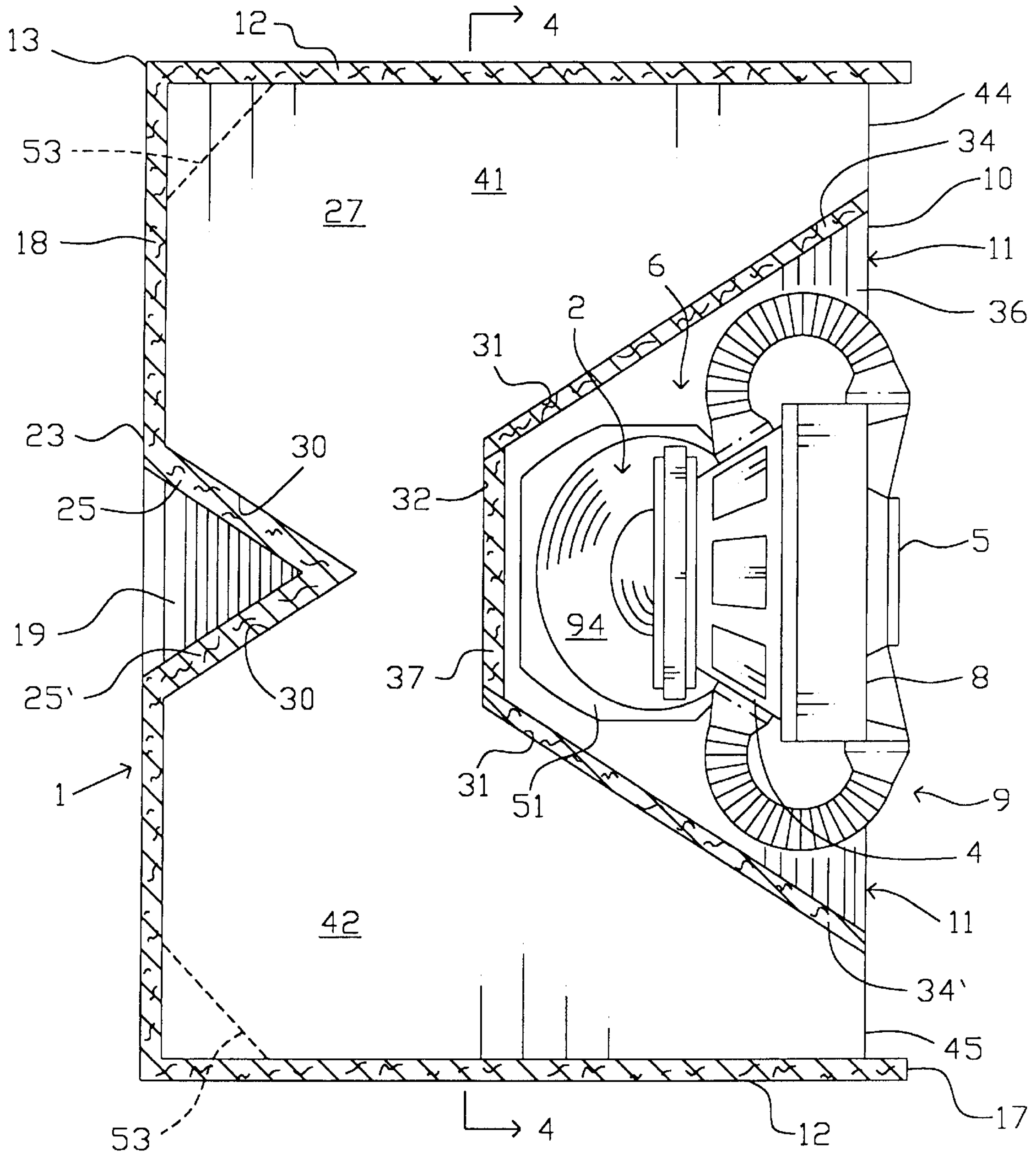
FIG. 3 is a cross-sectional view of the housing taken along line 3—3 of FIG. 1, with a side horn forming panel removed to show the speakers.
Figure 4:
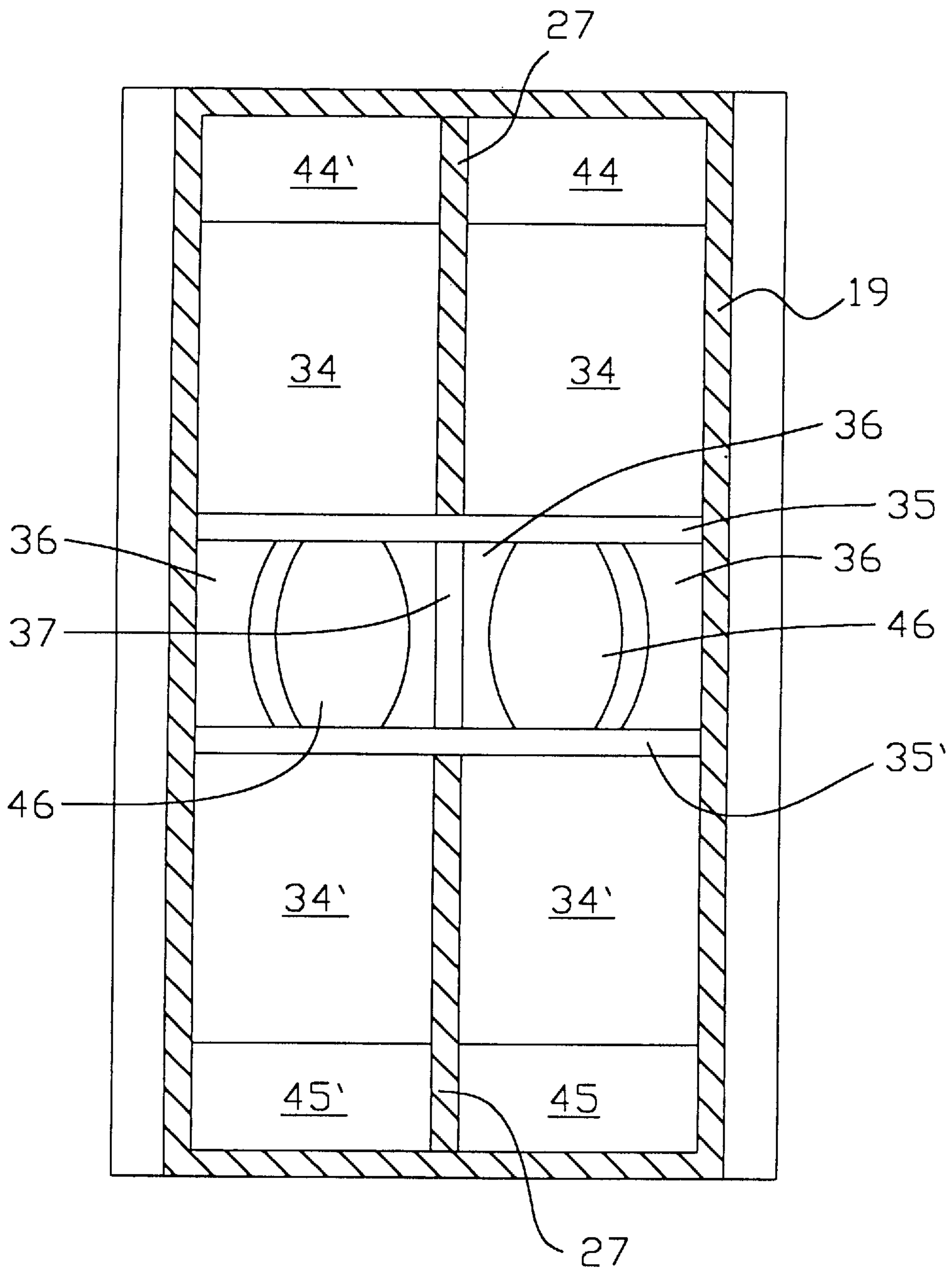
FIG. 4 is a cross-sectional view of the housing taken along line 4—4 of FIG. 3.

The housing 1 has bilateral symmetry on both central horizontal and vertical (front to rear) planes, the housing exterior being formed by identical top and bottom, horizontal, outer panels 12, each generally trapezoidal, corresponding with the outer profile of the plan view of the housing shown in FIG. 2, having a minor rear edge 13 joining opposite side edges 14 which have forwardly divergent major portions 15 and minor convergent portions 16 at respective junctions with a forwardly bowed, front edge or lip 17, respective of which edges are bridged by vertical, rear, and opposite major and minor side panels, 18, 19 and 20, respectively, with the lip 17 protruding forward of minor side panels 20. The rear panel has a central, rectangular cut-out 23 extending horizontally almost to opposite major side panels 19 and receives a triangular section insert 24 formed by identical upper and lower rectangular panels 25, 25', which are joined to upper and lower edges of the cut-out and to opposite side panels 19, providing a rearward opening cavity.

A vertical, central, rectangular interior, partition panel 27 spans the top and bottom panels 12 dividing the housing interior into identical left and right acoustic chamber systems and has a central rebate 30 in a rear edge which receives and mounts the panels 25, 25'. The front edge of partition panel 27 is also rebated, defining upper and lower rearward convergent edge portions 31 which extend from a location of the front edge portion adjacent and spaced from the junction with top and bottom panels 12 and terminating in an innermost vertical edge portion 32. Identical, upper and lower, inclined panels 34, 34', respectively, extend rearward in convergent relation rearward from front edges of respective vertical side panels 20, in spanning engagement therewith and with major side panels 19 for approximately one half their depth and are seated on upper and lower edge portions 31 with respective ear edges 35, 35' of the panels 34, 34' being spaced apart, and vertical, generally triangular, side, horn forming panels 36 extend rearward in convergent relation from front edges of vertical side panels 20 in spanning engagement with opposed surfaces of the upper and lower panels 34, 34' and have rebated apices 37 abutting together and seating on the vertical edge portion 32 of central partition panel 27. Thus, the side horn forming panels 36 cooperate with central portions of the upper and lower inclined panels 34, 34' which they bound to define the first horn while the side horn forming panels 36 cooperate with outer portions of the upper and lower inclined panels 34, 34' (outside the first horn) and the respective adjacent vertical walls 19 and 20 to provide identical, horizontally rearward divergent and vertically rearward convergent, sealed first acoustic chambers 39, 39' on respective opposite sides of the housing each. Each chamber 39 or 39' communicates via a rear vent 40 or 40' (FIG. 4) defined between portions of the spaced apart rear edges 35, 35' of the upper and lower inclined panels 34, 34', on opposite sides of the interior partition panel 27, with either one of pairs of identical, upper and lower, further expansion chambers 41, 42, or 41', 42' each of which is bounded by rear, vertical panel 13, inset panels 30, cornerpieces 53, a face of central partition panel 27, the portions of vertical side panels 19 and 20 which are not bounded between inclined panels 34, and the sides of inclined panels 34 which face top and bottom panels 12. The further expansion chambers 41, 42, or 41', 42' open to the ambient only at respective, further front rectangular vents 44, 45 or 44', 45 with elongate horizontal rims defined by front edges of top and bottom panels 12 and upper and lower inclined panels 34, 34' respectively, and vertical rims defined by front edges of the central partition panel 27 and respective minor side panels 20, respectively.

It will be appreciated that this construction defines two identical, essentially separate, sealed acoustic chamber systems on respective opposite sides of the partition panel 27.

Circular apertures 46 are cut out of the side horn panels 35 in registration with which front faces of the speakers 2 and 3 are mounted by their flanges 51 so that front waves thereof project forwardly into the first horn 6 and rear waves project into respective chambers 40, 40'. The vents 40, 40' interconnecting respective first chambers with respective expansion chambers balance the loading on the rear face of the cones with the loading on the front faces of the cones of first and second speakers.

Both wall portions of the first housing chambers 40, 40' and wall portions of the expansion chambers 41, 42 and 41', 42' are spaced apart by a distance less than that which would permit resonance therebetween at an upper limit of the operating frequency of the first and second speakers 2 and 3, while the further vents 44, 45 and 44', 45 are tuned below 100 Hz. Cornerpieces 53 are located in the further expansion chambers to ensure prevention of resonances.

All panels are made from ¾ inch birch ply and all panel junctions are acoustically sealed. Four access holes, closed by handle plates, (not shown), are provided in portions of outer major vertical wall 19 defining respective chambers 41,42;41'42'.

Figure 5:
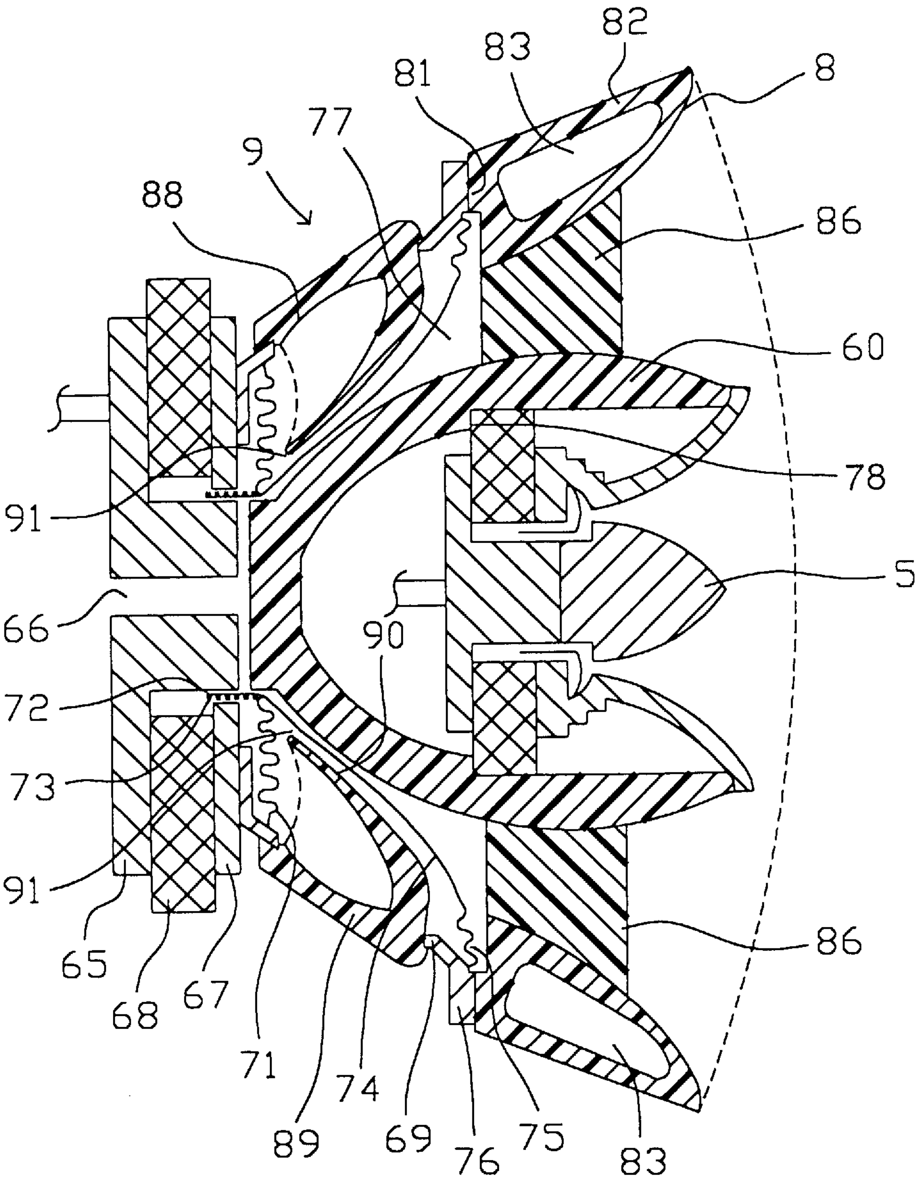
FIG. 5 is a fragmentary cross-sectional view taken along lines 5—5 of FIG. 1 showing the high-mid and high frequency speakers assembly.
Figure 6:
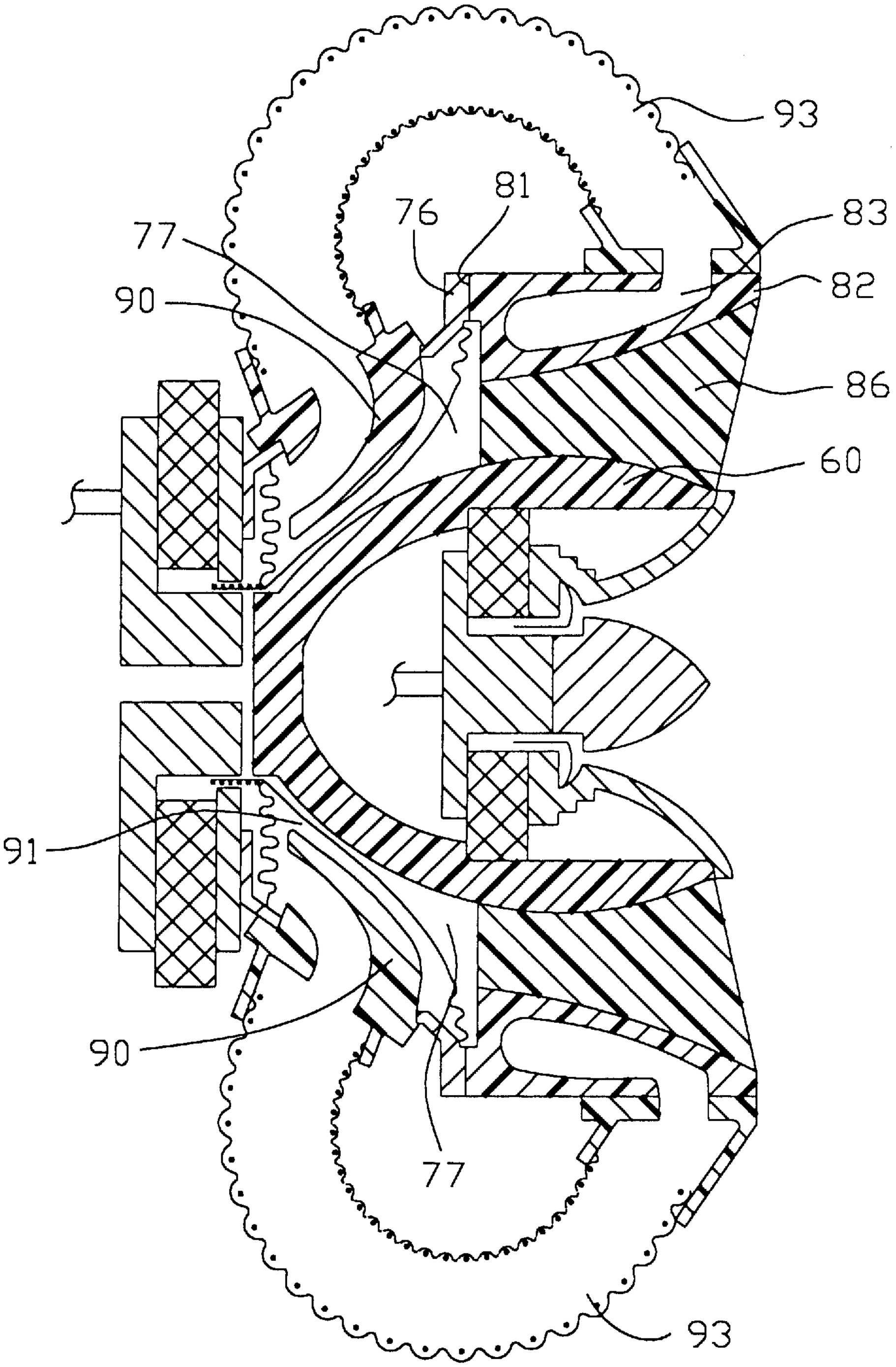
FIG. 6 is a fragmentary cross-sectional view taken in an orthogonal plane to FIG. 5, along lines 6—6 of FIG. 1, showing the high-mid and high frequency speakers assembly.
Figure 7:
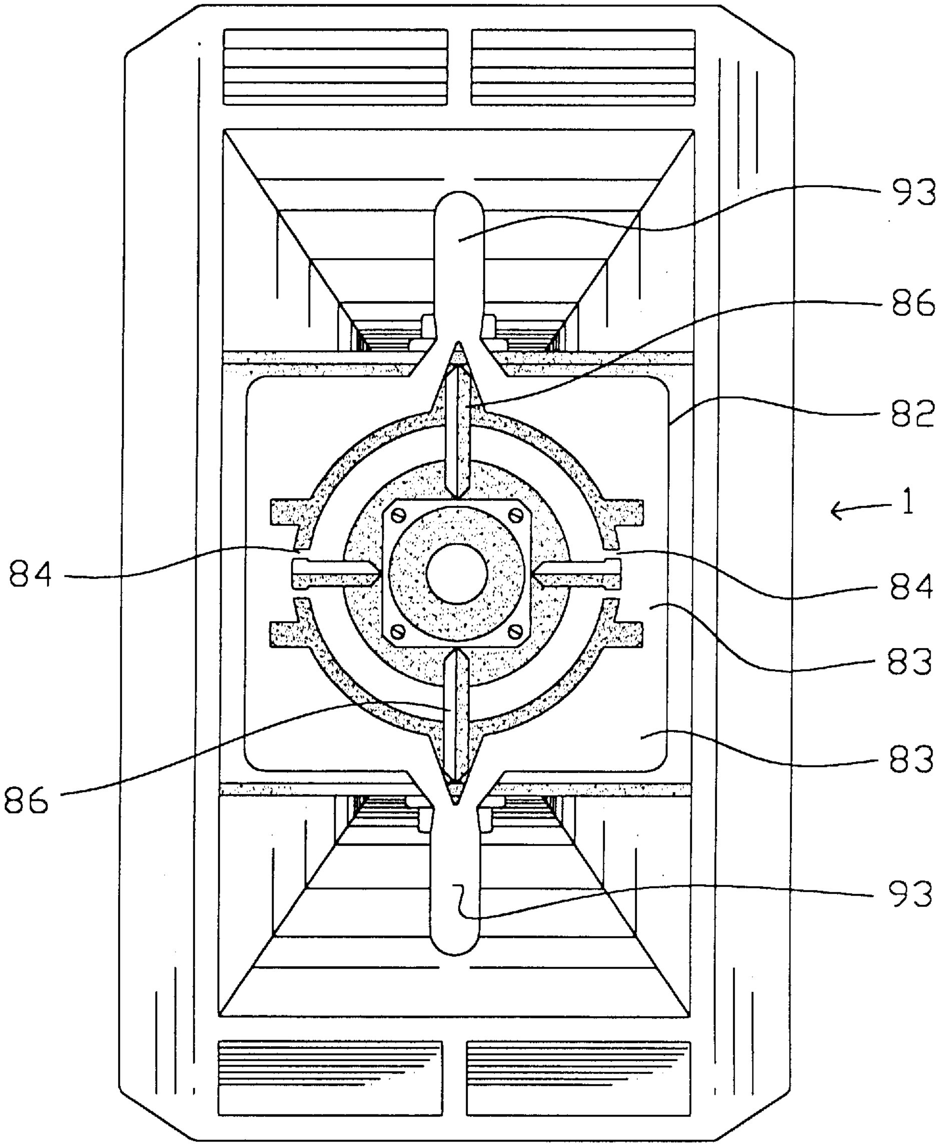
FIG. 7 is a view similar to FIG. 1 partly broken away to show chambers of the horn casing of the high-mid and high frequency speaker assembly; and, FIG. 8 is a graph comparing crossover points obtained by the system of the invention with conventional crossover points of the prior art.

As shown particularly in FIGS. 5 and 6, the front speaker assembly 9 comprises a 10 inch speaker 4 and a tweeter 5 coaxially mounted in a hollow phase plug 60 integrally formed with the second horn 8.

The speaker 4 comprises an integral bottom plate and pole piece 65 having an axially extending vent 66, a pancake magnet 68 and a top plate 67 to which is mounted an apertured metal basket 69 carrying a spider 71 suspending former 72, coil 73 and apex of cone driver 74, the base of which is suspended on surround 75 attached to a flange 76. The flange 76 is mounted on a rear face 81 of a casing 82 of the second horn 8 which has an open apex, a mouth and an axis extending centrally therebetween, the apex being matched with a basal circumference of a cone of the third speaker and mounted coaxially therewith and cooperating with the phase plug to provide a continuation of the annular duct. The horn casing 82 is formed with a system of internal expansion chambers 83 having radially inner vents 84 communicating with the ambient. The casing 82 is connected by radial struts 86 to the outer periphery of the hollow phase plug portion 60 which has a front to rear axis of symmetry and extends coaxially back to within approximately ⅛ inch of the pole piece (or as close as possible while permitting extension thereof at the operating frequency). The outer periphery of the phase plug 60 is profiled to cooperate with the wall of the former 72 and the cone 74 to define an annular duct 77 with an expansion ratio extending substantially from the pole piece 65 to the base/mouth of the cone into the ambient while being spaced from the cone by a distance less than that which would permit resonance therebetween at an upper limit of the operating frequency of the third speaker. The phase plug is formed with a forward opening socket 78 and the bullet tweeter 5 is releasably seated therein, permitting ready substitution of an alternative type of tweeter.

A rear face of the cone is sealed against a front pressure wave generated by the first and second speakers by blocking the usual basket apertures 88 with individual plastic contour pieces 89 which are cavitied for weight and material saving and have an inner surface portion 90 profiled to conform substantially with a rear profile of the cone driver 74 so as to define opposed walls of a first annular chamber 91 spaced from the cone driver by a distance less than that which would permit resonance therebetween at an upper limit of the operating frequency of the third speaker 4. A pair of resiliently flexible (plastic) venting tubes 93 connect diametrically opposite portions of the chamber 91 to the further, vented expansion chamber system 83 in the casing of the second horn so that the loading on the rear face of the cone balances the loading on the front face of the cone and the vents 84 detune the rear wave below a lower operational crossover of the third speaker.

The casing 82 of the second horn 8 provides a horizontally wide aspect ratio and divides the mouth of the first horn 6 into two equal horn mouth portions 11 having areas at least equal to the areas of the cone drivers 94 of the first and second speakers and is being aligned on respective opposite sides of and perpendicular to the common plane and in communication with both first and second speakers.

As the axial through-passageway 66 in the pole piece 65 is in communication with front waves of the first and second speakers 2,3, cooling air, generated by the front pressure waves of the first and second speakers passes through the through-passageway and is deflected by the rear face of the phase plug 60 radially across a central portion of the front face of the pole piece and onto the former thereby cooling the coil.

The phase plug is made of plastic mixed with pumice and aluminum particles for weight reduction and enhanced heat conduction, respectively. The addition of metal particles to the portion adjacent the pole piece can assist in controlling stray flux generated by the voice coil further reducing harmonic distortion. The metal loading of the phase plug material may also be useful in suppressing coil inductance distortion arising from modulation of total pole flux by the motor coil flux variations, notably odd order harmonics, see Page 79 "High Performance Loudspeakers", Colloms 1992. The phase plug and second horn are integrally molded as one piece with precursors of the chambers being formed by respective cavities which open to the outer minor edges of the second horn and are sealed by cover plates (not shown) after molding.

The first and second speakers are operated over a low-mid frequency range, the third speaker is operated over a high-mid frequency range and the fourth speaker is operated over a high frequency range so that a range of approximately 150 h–5 kH can be reproduced at a high performance level with only a single crossover point between speakers of substantially equivalent size and type.

The front speaker assembly forms a high-mid/high unit designed to operate from 600 Hz to 21 KHz, but capable of operation down to 300 Hz. It will, however, be appreciated that the precise frequency ranges will be selected according to the specific application.

In the system of the invention, as a result of the rear loading by housing chambers, and the provision of multiple speakers, a downward extension of the conventional 10 inch speaker range to the frequency range conventionally produced by a 15 inch speaker is possible. The front loading by the third speaker assembly 9 provides a significant gain in efficiency and effecting coupling to the atmosphere together with a reduction in beaming at higher frequencies.

The extension of the frequency response of the third 10 inch speaker to a higher than conventional frequency range is enabled as any requirement to operate as low as 1 kHz has been obviated. Furthermore, the production of useful high frequencies at the apex of the cone is permitted by elimination of the conventional dust cap and the proximity of the phase plug to ⅛ inch of the pole piece, aided by the contour pieces on the basket which prevent high frequency cavity resonance reflections from the magnet and back face of speaker, enabling the 10 inch speaker to be driven up to 6 kHz without distortion. As the third mid speaker 4 can now be operated up to 6 kHz, the tweeter need not operate down to 2 kHz, and its diaphragm can be reduced to as small as 1 inch in size with a frequency response up to 21 kHz, or higher, eliminating distortions inherent with high compression drivers operating at the lower frequencies.

The venting of the rear of the third speaker through multiple chambers within the inner horn bell body or casing detunes the back wave to below the resonance frequencies at which the loudspeaker is operating.

In the normal operating mode, the vests from the horn bell body do not deliver a usable amount of sound but are only for venting, and can be sealed.

Figure 8:
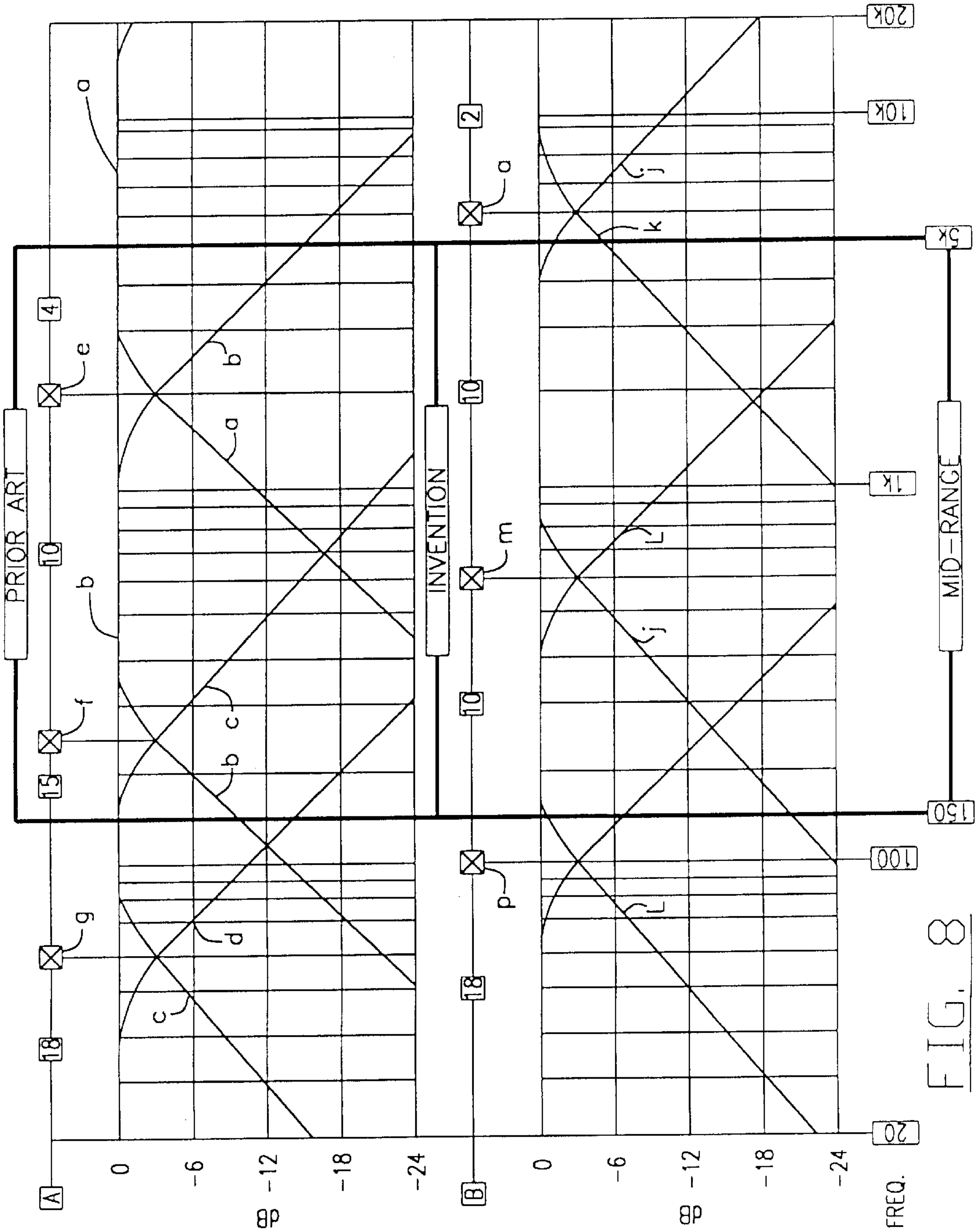

As illustrated graphically in FIG. 8, the conventional prior art systems utilizing a 4 inch, high frequency compression driver for the useful range of 2 kHz–16 kHz, as shown by line a, 10 and 15 inch cone drivers for upper and lower mid ranges of 250 Hz to 2 kHz and 60 Hz to 250 Hz, respectively shown by lines b and c, respectively, and an 18 inch woofer for below 60 Hz, shown by line d. This results in three crossover points at −3 dB, at e, f, and g, respectively, two of which, e and f, lie within the most important range of 150 Hz–5 kH, which contains the range of maximum acuity of the human ear, and the greatest concentration of information in normal program material. Moreover, the crossover at e is between transducers of different size and type, (the metal diphragmed high compression driver and the cone driver), resulting in detectable distortion between 1.7 and 3 kHz together with the distortions notorious in the low end of the high compression driver; and the crossover at f is between two cone drivers of markedly different sizes, 10 and 15 inch, resulting in detectable distortion between 170 and 370 kHz.

However, in the system of the invention, the ranges of the 10 inch speakers can be extended both upward, in the case of the third speaker, and downward in the case of the first two speakers. The upward extension of the third speaker from 600 Hz to 6 kHz according to line j permits a smaller, 2 (or 1) inch tweeter to be utilized and operated from as low 6 kHz up to 21 kHz according to line k, and the downward extension of the first two speakers enables operation from 600 Hz down to 100 Hz according to line I which results in only a single crossover point m (at 600 Hz) within the most important range and that between equivalent speakers with the other two crossovers p, q, at 100 Hz and 6 kHz, outside the range which results in a marked improvement of fidelity.

If, for convenience or cost, elimination of the woofer is sought, as a result of the provision of the two front and rear wave loaded 10 inch speakers, sufficient low end power at lowered operating frequencies (down to 40 Hz) is still available for smaller auditoriums with the front vents then acting as ports resulting in an extremely economical system with improved good fidelity.

Several advantages accrue from the construction of the high/high-mid speaker unit. The time displacement of the high frequency driver can be conveniently corrected by the time constants of passive crossovers. The heavy mass of the high frequency driver within the phase plug greatly assists in ameliorating unwanted resonances from the cone driver of the high-mid horn 4. As the output from the high-mid speaker 4 is largely projected through top and bottom section of the mouth of the second horn separated by the phase plug and tweeter, two, in-phase axial response zones are created centered at crossover, above and below the high frequency driver, respectively, and selectively changing the delay to the high frequency driver selectively varies (or focusses) the separation of the response zones simultaneously, effectively controlling the vertical and, partially, the horizontal, response tailoring the system to a particular environment. This also forms a line source to couple frequencies forward and tighten the vertical response, the wider aspect ratio of the side sections of the horn casing (also bisected by the phase plug) spread upper mid range frequencies that might otherwise beam forward.

This compact and easily transportable system is extremely versatile, while the high/high-mid unit forming the front speaker assembly is useful, when not mounted to the low mid unit, (from which it is readily removed by four bolts holding the high/high-mid unit to the housing/low-mid unit), for example, as a foldback monitor for hearing a mix of instrument or vocals in a live stage location; as satellite speakers in theaters, stores, homes and spot coverage situations, as the front speaker assembly can handle frequencies from 250 Hz to 21 kHz in confined spaces; racked in stadium arrays or to cover 360 degrees in a disco situation.

It will be apparent that the system can be manufactured economically by adapting conventional and therefore, inexpensive, speakers.

What I claim is:

1. A high performance loudspeaker system comprising:

a housing; and four speakers mounted in the housing so as to provide a common direction of sound projection into the ambient and having respective speaker axes on a common plane, the housing comprising wall portions of a horn;

a first and a second of the speakers being identical and having respective cones with front faces mounted in opposition on said wall portions; and, a third and a fourth of the speakers being mounted together coaxially, forming a speaker assembly, and the speaker assembly being mounted to the housing medially spanning the horn mouth in loading relation with front faces of the first and second speakers and cooperating with the wall portions to provide two, separate, horn mouth portions having areas at least equal to the areas of the cones of the first and second speakers and being aligned on respective opposite sides of and perpendicular to the common plane and in communication with both first and second speakers;

the third speaker being of equivalent size to the first and second speakers and having a pole piece, a former and a cone and means sealing a rear face of the cone against a front pressure wave generated by the first and second speakers, the sealing means having an inner surface portion profiled to conform substantially with a rear profile of the cone so as to be spaced from the cone by a distance less than that which would permit resonance therebetween at an upper limit of the operating frequency of the third speaker while permittinq extension of the cone of the third speaker at the lower limit of the operating frequency of the third speaker; and phase plug means having a front to rear axis of symmetry and mounted in front of the pole piece to extend coaxially therewith, the phase plug means cooperating with a wall of the former and the cone to define an annular duct with an expansion ratio extending substantially from the pole piece to the base of the cone into the ambient while being spaced from the cone by a distance less than that which would permit resonance therebetween at an upper limit of the operating frequency of the third speaker while permitting extension of the cone at the lower limit of the operating frequency of the third speaker, the phase plug means having a forwardly opening socket and the fourth speaker being mounted therein, the first and second speakers being operational over a low-mid frequency range, the third speaker being operational over a high-mid frequency range and the fourth speaker being operational over a high frequency range so that a range of approximately 150 Hz–5 kHz can be reproduced at a high performance level with only a single crossover point between speakers of substantially equivalent size and type.

2. A high performance loudspeaker system according to claim 1 wherein the speaker assembly further comprises a second horn having an open apex, a mouth and an axis extending centrally therebetween, the apex being matched with a basal circumference of a cone of the third speaker and mounted coaxially therewith and cooperating with the phase plug to provide a continuation of the annular duct.

3. A high performance loudspeaker system according to claim 1, wherein the means sealing the rear of the cone cooperates with the cone to form opposed wall portions of a first chamber which wall portions are spaced apart by a distance less than that which would permit resonance therebetween at an upper limit of the operating frequency of the third speaker while permitting extension of the cone at the lower limit of the operating frequency of the third speaker and the speaker assembly includes at least one further, expansion chamber and vent means in the sealed rear interconnects said first chamber and said at least one further expansion chamber to balance the loading on the rear face of the cone with the loading on the front face of the cone.

4. A high performance loudspeaker system according to claim 2, wherein the means sealing the rear of the cone cooperates with the cone to form opposed wall portions of a first chamber which wall portions are spaced apart by a distance less than that which would permit resonance therebetween at an upper limit of the operating frequency of the third speaker while permitting extension of the cone at the lower limit of the operating frequency of the third speaker and the speaker assembly includes at least one further, expansion chamber and vent means in the sealed rear interconnects said first chamber and said at least one further expansion chamber so that the loading on the rear face of the cone balances the loading on the front face of the cone.

5. A high performance loudspeaker system according to claim 1, wherein the means sealing the rear of the cone cooperates with the cone to form opposed wall portions of a first chamber which wall portions are spaced apart by a distance less than that which would permit resonance therebetween at an upper limit of the operating frequency of the third speaker while permitting extension of the cone at the lower limit of the operating frequency of the third speaker and the speaker assembly includes at least one further, expansion chamber and vent means in the sealed rear interconnects said first chamber and said further expansion chamber, and at least one further vent connecting the further expansion chamber to the ambient so as to tune the rear wave below a lower operational crossover of the third speaker and so that the loading on the rear face of the cone balances the loading on the front face of the cone.

6. A high performance loudspeaker system according to claim 4 wherein the second horn has a peripheral body casing in which said at least one further expansion chamber is formed.

7. A high performance loudspeaker system according to claim 4 comprising at least one further vent connecting the further expansion chamber to the ambient so as to detune the rear wave below a lower operational crossover of the third speaker and so that the loading on the rear face of the cone balances the loading on the front face of the cone.

8. A high performance loudspeaker system according to claim 7 wherein the second horn has a peripheral body casing said at least one further expansion chamber and further vent is formed.

9. A high performance loudspeaker system according to claim 1 wherein the housing provides first and second housing chamber systems, the first housing chamber system comprising a housing chamber communicating with a rear wave of the first speaker and having chamber wall portions spaced apart by a distance less than that which would permit resonance therebetween at an upper limit of the operating frequency of the first speaker while permitting extension of the cone at the lower limit of the operating frequency of the first speaker, and at least one further, housing expansion chamber and vent means interconnecting said housing chamber and said further housing expansion chamber, and at least one further vent tuned below 100 Hz connecting the further housing expansion chamber to the ambient, the second housing chamber system comprising a housing chamber communicating with a rear wave of the second speaker and having chamber wall portions spaced apart by a distance less than that which would permit resonance therebetween at an upper limit of the operating frequency of the second speaker while permitting extension of the cone of the second speaker at the lower limit of the operating frequency of the second speaker, and at least another, housing expansion chamber and vent means interconnecting the housing chamber of the second housing chamber system and said another housing expansion chamber, and at least another vent tuned below 100 Hz connecting said another housing expansion chamber to the ambient.

10. A high performance loudspeaker system according to claim 5 wherein the housing provides first and second housing chamber systems, the first housing chamber system comprising a housing chamber communicating with a rear wave of the first speaker and having chamber wall portions spaced apart by a distance less than that which would permit resonance therebetween at an upper limit of the operating frequency of the first speaker, and at least one further, housing expansion chamber and vent means interconnecting said housing chamber and said further housing expansion chamber, and at least one further vent tuned below 100 Hz connecting the further housing expansion chamber to the ambient, the second housing chamber system comprising a housing chamber communicating with a rear wave of the second speaker and having chamber wall portions spaced apart by a distance less than that which would permit resonance therebetween at an upper limit of the operating frequency of the second speaker while permitting extension of the cone of the second speaker at the lower limit of the operating frequency of the second speaker, and at least another, housing expansion chamber and vent means interconnecting the housing chamber of the second housing chamber system and said another housing expansion chamber, and at least another vent tuned below 100 Hz connecting said another housing expansion chamber to the ambient, the second housing chamber system comprising a housing chamber communicating with a rear wave of the second speaker and having chamber wall portions spaced apart by a distance less than that which would permit resonance therebetween at an upper limit of the operating frequency of the second speaker.

11. A high performance loudspeaker system according to claim 1 wherein the pole piece has an axial through-passageway in communication with front waves of the first and second speakers and the phase plug means has a rear face spaced axially from a front of the pole piece to provide a cooling air admitting gap therebetween so that cooling air, generated by the front pressure waves of the first and second speakers passes through the through-passageway and is deflected by the rear face of the phase plug means radially across a front face of the pole piece, onto the former, thereby cooling the coil.

12. A loudspeaker assembly comprising:

a first and a second speaker being mounted together coaxially, the first speaker having a pole piece, a former and a cone and means sealing a rear face of the cone, the sealing means having an inner surface portion profiled to conform substantially with a rear profile of the cone so as to be spaced from the cone by a distance less than that which would permit resonance therebetween at an upper limit of the operating frequency of the first speaker while permitting extension of the cone at the lower limit of the operating frequency of the first speaker; and phase plug means having a front to rear axis of symmetry and mounted in front of the pole piece to extend coaxially therewith, the phase plug means cooperating with a wall of the former and the cone to define an annular duct with an expansion ratio extending substantially from the pole piece to the base of the cone into the ambient while being spaced from the cone by a distance less than that which would permit resonance therebetween at an upper limit of the operating frequency of the first speaker while permitting extension of the cone at the lower limit of the operating frequency of the first speaker, the phase plug means having a forwardly opening socket and the second speaker being mounted in the socket.

13. A loudspeaker assembly according to claim 12, further comprising a horn having an open apex, a mouth and an axis extending centrally therebetween, the apex being matched with a basal circumference of a cone of the first speaker and mounted coaxially therewith and cooperating with the phase plug to provide a continuation of the annular duct.

14. A loudspeaker assembly according to claim 12, wherein the means sealing the rear of the cone cooperates with the cone to form opposed wall portions of a first chamber which wall portions are spaced apart by a distance less than that which would permit resonance therebetween at an upper limit of the operating frequency of the first speaker while permitting extension of the cone at the lower limit of the operating frequency of the first speaker and the speaker assembly includes at least one further, expansion chamber and vent means in the sealed rear interconnects said first chamber and said at least one further expansion chamber to balance the loading on the rear face of the cone with the loading on the front face of the cone.

15. A loudspeaker assembly according to claim 13, wherein the means sealing the rear of the cone cooperates with the cone to form opposed wall portions of a first chamber which wall portions are spaced apart by a distance less than that which would permit resonance therebetween at an upper limit of the operating frequency of the first speaker while permitting extension of the cone at the lower limit of the operating frequency of the first speaker and the speaker assembly includes at least one further, expansion chamber and vent means in the sealed rear interconnects said first chamber and said at least one further expansion chamber so that the loading on the rear face of the cone balances the loading on the front face of the cone.

16. A loudspeaker assembly according to claim 12, wherein the means sealing the rear of the cone cooperates with the cone to form a opposed wall portions of a first chamber which wall portions are spaced apart by a distance less than that which would permit resonance therebetween at an upper limit of the operating frequency of the first speaker while permitting extension of the cone at the lower limit of the operating frequency of the first speaker and the speaker assembly includes at least one further, expansion chamber and vent means in the sealed rear interconnects said first chamber and said further expansion chamber, and at least one further vent connecting the further expansion chamber to the ambient so as to tune the rear wave and so that the loading on the rear face of the cone balances the loading on the front face of the cone.

17. A loudspeaker assembly according to claim 13 wherein the horn has a peripheral body casing in which said at least one further expansion chamber is formed.

18. A loudspeaker assembly according to claim 13 comprising at least one further vent connecting the further expansion chamber to the ambient so as to tune the rear wave and so that the loading on the rear face of the cone balances the loading on the front face of the cone.

19. A loudspeaker assembly according to claim 15 wherein the second horn has a peripheral body casing in which said at least one further expansion chamber and further vent is formed.

20. A loudspeaker assembly according to claim 12 wherein the first speaker is operational over a high-mid frequency range and the second speaker is operational over a high frequency range.

21. A loudspeaker assembly according to claim 12 wherein the pole piece has an axial through-passageway communicating outside the rear and the phase plug means has a rear face spaced axially from a front of the pole piece to provide a cooling air admitting gap therebetween so that cooling air, can pass from behind the first speaker through the through-passageway and be deflected by the rear face of the phase plug means radially across a front face of the pole piece, onto the former, thereby cooling the coil.

22. A loudspeaker assembly according to claim to claim 12 wherein the second speaker is releasably mounted in the socket.

23. A loudspeaker assembly according to claim to claim 13 wherein the phase plug and second horn are integrally molded as one piece.

24. A high performance loudspeaker system comprising:

a housing; and four speakers mounted in the housing so as to provide a common direction of sound projection into the ambient and having respective speaker axes on a common plane, the housing comprising wall portions of a horn;

a first and a second of the speakers being identical and having respective cones with front faces mounted in opposition on said wall portions; and, a third and a fourth of the speakers being mounted together coaxially, forming a speaker assembly, and the speaker assembly being mounted to the housing medially spanning the horn mouth in loading relation with front faces of the first and second speakers and cooperating with the wall portions to provide two, separate, horn mouth portions having areas at least equal to the areas of the cones of the first and second speakers and being aligned on respective opposite sides of and perpendicular to the common plane and in communication with both first and second speakers;

the third speaker being of equivalent size to the first and second speakers and having a pole piece, a former and a cone and means sealing a rear face of the cone against a front pressure wave generated by the first and second speakers, the sealing means having an inner surface portion profiled to conform substantially with a rear profile of the cone so as to be spaced from the cone by a distance less than that which would permit resonance therebetween at an upper limit of the operating frequency of the third speaker while permitting extension of the cone at the lower limit of an operating frequency of the third speaker;

the first and second speakers being operational over a low-mid frequency range, the third speaker being operational over a high-mid frequency range and the fourth speaker being operational over a high frequency range so that a range of approximately 150 Hz–5 kHz can be reproduced at a high performance level with only a single crossover point between speakers of substantially equivalent size and type.

* * * * *